United States Patent
Nakata

(10) Patent No.: US 10,211,323 B2
(45) Date of Patent: Feb. 19, 2019

(54) HEMT HAVING HEAVILY DOPED N-TYPE REGIONS AND PROCESS OF FORMING THE SAME

(71) Applicant: Sumitomo Electric Industries, Ltd., Osaka-shi (JP)

(72) Inventor: Ken Nakata, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/903,342

(22) Filed: Feb. 23, 2018

(65) Prior Publication Data
US 2018/0182871 A1 Jun. 28, 2018

Related U.S. Application Data

(62) Division of application No. 15/280,370, filed on Sep. 29, 2016.

(30) Foreign Application Priority Data

Sep. 30, 2015 (JP) .................. 2015-194350

(51) Int. Cl.
*H01L 29/66* (2006.01)
*H01L 29/778* (2006.01)
(Continued)

(52) U.S. Cl.
CPC .... *H01L 29/66969* (2013.01); *H01L 21/0254* (2013.01); *H01L 21/0262* (2013.01);
(Continued)

(58) Field of Classification Search
CPC .......... H01L 29/66969; H01L 29/0843; H01L 29/66462; H01L 29/267; H01L 21/467;
(Continued)

(56) References Cited

U.S. PATENT DOCUMENTS 4,632,713 A * 12/1986 Tiku .................. H01L 21/28581
257/260
7,714,359 B2  5/2010 Nakazawa et al.
(Continued)

FOREIGN PATENT DOCUMENTS

JP  2005-268493 A  9/2005
JP  2006-261642 A  9/2006

*Primary Examiner* — Jonathan Han
(74) *Attorney, Agent, or Firm* — Venable LLP; Michael A. Sartori; Kerri M. Patterson

(57) ABSTRACT

A HEMT made of nitride semiconductor materials and a process of forming the same are disclosed, where the HEMT has n-type regions beneath the source and drain electrodes with remarkably increased carrier concentration. The HEMT provides the n-type regions made of at least one of epitaxially grown ZnO layer and MgZnO layer each doped with at least aluminum and gallium with density higher than $1 \times 10^{20}$ cm$^{-3}$. The process of forming the HEMT includes steps of forming recesses by dry-etching, epitaxially growing n-type layer, removing surplus n-type layer except within the recesses by dry-etching using hydrocarbon, and forming the electrodes on the n-type layer.

9 Claims, 6 Drawing Sheets

(51) Int. Cl.
  *H01L 21/02*   (2006.01)
  *H01L 29/267*  (2006.01)
  *H01L 29/24*   (2006.01)
  *H01L 29/205*  (2006.01)
  *H01L 21/306*  (2006.01)
  *H01L 21/467*  (2006.01)
  *H01L 29/08*   (2006.01)
  *H01L 29/22*   (2006.01)
  *H01L 29/227*  (2006.01)
  *H01L 21/465*  (2006.01)
  *H01L 29/20*   (2006.01)

(52) U.S. Cl.
  CPC .. *H01L 21/02554* (2013.01); *H01L 21/02565* (2013.01); *H01L 21/30621* (2013.01); *H01L 21/465* (2013.01); *H01L 21/467* (2013.01); *H01L 29/0843* (2013.01); *H01L 29/0847* (2013.01); *H01L 29/205* (2013.01); *H01L 29/22* (2013.01); *H01L 29/227* (2013.01); *H01L 29/24* (2013.01); *H01L 29/267* (2013.01); *H01L 29/66462* (2013.01); *H01L 29/7786* (2013.01); *H01L 21/02458* (2013.01); *H01L 21/02502* (2013.01); *H01L 21/02576* (2013.01); *H01L 29/2003* (2013.01)

(58) Field of Classification Search
  CPC ..... H01L 29/205; H01L 29/22; H01L 29/227; H01L 29/24; H01L 29/7786; H01L 21/0254; H01L 21/02554; H01L 21/0262; H01L 21/306
  USPC ... 257/194, 76, E29.246, E29.253, E21.407; 438/172
  See application file for complete search history.

(56) References Cited

U.S. PATENT DOCUMENTS

| | | | |
|---|---|---|---|
| 2003/0203604 A1* | 10/2003 | Makita | H01L 21/0242 438/571 |
| 2009/0034568 A1* | 2/2009 | Nakahara | H01L 29/045 372/44.01 |
| 2009/0260563 A1* | 10/2009 | Omichi | C23C 14/086 117/2 |
| 2010/0102309 A1 | 4/2010 | Nakahara et al. | |
| 2011/0284865 A1* | 11/2011 | Inoue | H01L 29/0843 257/76 |
| 2014/0124792 A1 | 5/2014 | Hagleitner et al. | |
| 2014/0203289 A1* | 7/2014 | Liu | H01L 29/432 257/76 |
| 2014/0203322 A1 | 7/2014 | Chang et al. | |
| 2014/0264379 A1* | 9/2014 | Kub | H01L 29/41725 257/77 |

\* cited by examiner

US 10,211,323 B2

HEMT HAVING HEAVILY DOPED N-TYPE REGIONS AND PROCESS OF FORMING THE SAME

CROSS-REFERENCE TO RELATED APPLICATIONS

This application is a Divisional of U.S. patent application Ser. No. 15/280,370, filed Sep. 29, 2016, which claims the benefit of Japanese Patent Application No. 2015-194350, filed Sep. 30, 2015.

BACKGROUND OF INVENTION

1. Field of the Invention

The present invention relates to a field effect transistor (FET) type of

2. Background Arts

A Japanese Patent laid open No. JP-2006-261642A has disclosed an FET and a method of making the FET. FIG. 6 shows a cross section of the FET disclosed in the patent document above. The FET 100 includes an undoped GaN buffer layer 102 that forms a channel, an n-type AlGaN electron supply layer 103, and an n-type InAlGaN cap layer 104, where these layers are sequentially grown on a sapphire substrate 101 in this order. Provided on the n-type InAlGaN cap layer 104 is ohmic electrodes 105 made of a stack of titanium (Ti) and aluminum (Al), where they operate as a source electrode and a drain electrode, respectively. The n-type InAlGaN cap layer 104 exposes a portion of the n-type AlGaN electron supply layer 103, and a Shottky electrode 106 made of another stack of palladium (Pa) and silicon (Si), which operates as a gate electrode, is in contact to the exposed n-type AlGaN electron supply layer 103.

SUMMARY OF INVENTION

One aspect of the present invention relates to a high electron mobility transistor (HEMT) made of nitride semiconductor materials. The HEMT comprises a channel layer, a barrier layer, n-type regions, and source, drain, and gate electrodes. The channel layer and the barrier layer may be made of nitride semiconductor materials. The barrier layer has bandgap energy greater than that of the channel layer. The n-type regions may be made of at least one of zinc oxide (ZnO) and magnesium zinc oxide (MgZnO), each doped with at least aluminum (Al) and gallium (Ga). The source and the drain electrodes are provided on the n-type regions, but the gate electrode is provided on the barrier layer.

Another aspect of the present invention relates to a process of forming a high electron mobility transistor (HEMT) made of nitride semiconductor materials. The process comprises: (a) forming a semiconductor stack on a substrate by epitaxial growing the nitride semiconductor materials; (b) forming recesses by etching portions of the semiconductor stack; (c) epitaxially growing n-type film made of at least one of zinc oxide (ZnO) and magnesium zinc oxide each doped with at least one of aluminum (Al) and gallium (Ga); (d) partially removing the n-type film except within the recesses by a dry-etching using hydrocarbon; and (e) forming source and drain electrodes on the n-type regions.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Figure 1:
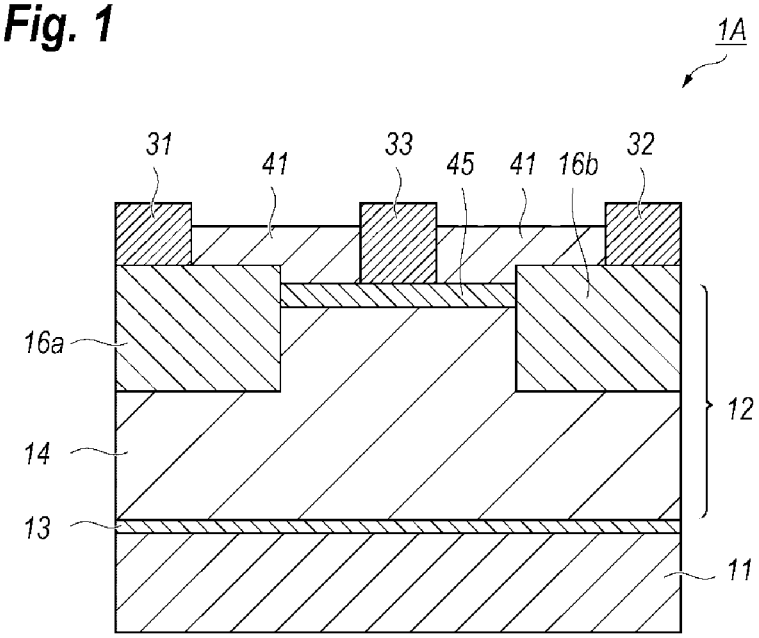
FIG. 1 shows a cross section of a high electron mobility transistor HEMT according to embodiment of the present invention.

Nitride semiconductor materials, typically gallium nitride (GaN), are to be applied in a transistor operable in high frequencies under high biases because of wider bandgap energy inherently attributed thereto. In particular, a heterointerface between a GaN layer and an AlGaN layer, or between a GaN layer and an InAlN layer, induces electrons in a high concentration, exactly, in the GaN layer adjacent to the hetero-interface, which is often called as a two-dimensional electron gas (2DEG). Especially, InAlN may induce the electrons in the hetero-interface against GaN in extremely high concentration compared with other nitride semiconductor materials.

In order to enhance the high frequency performance of a transistor, namely, in order to increase a cut-off frequency thereof, the transistor is necessary to reduce parasitic capacitance and resistance around the gate electrode and to increase trans-conductance. A thinner electron supply layer may effectively enhance the trans-conductance gm. Because InAlN may induce the electrons with a higher concentration even when a thickness thereof is thin, InAlN is preferably used as an electron supply layer on the channel layer made of GaN. Also, reduction of access resistance between the source electrode and the gate electrode becomes effective to enhance the trans-conductance.

However, such reduction is practically hard. For a case of a HEMT made of gallium arsenide (GaAs) related materials, a heavily doped n-type GaAs provided on the electron supply layer, which is usually made of AlGaAs, may effectively reduce the contact resistance of the source electrode formed on the n-type GaAs layer. On the other hand, for a HEMT made of GaN related materials, when a heavily doped n-type GaN layer is formed on the electron supply layer made of InAlN and a source electrode on this n-type GaN layer, an interface between the n-type GaN layer and the InAlN electron supply layer may induce carries thereat, which increases an energy difference between the bottom of the conduction band in the InAlN electron supply layer and the Fermi level thereof, namely, this enhances a band discontinuity between the n-type GaN layer and the InAlN layer, which becomes a barrier for the carrier transportation and raises the resistance. Thus, the n-type GaN layer may reduce the contact resistance against the source electrode, but increase access resistance between the source electrode and the gate electrode.

A modified arrangement of a HEMT made of GaN related materials may provide an n-type GaN layer so as to fill a recess that reaches the channel layer under the InAlN electron supply layer, and the source electrode formed on this n-type GaN layer. In such an arrangement, the n-type GaN layer is directly in contact to the interface between the InAlN electron supply layer and the channel layer, where the two-dimensional electron gas (2DEG) is induced; accordingly, the HEMT having this arrangement may have reduced access resistance.

Next, embodiment of the HEMT according to the present invention will be described as referring to drawings. In the description of the drawings, numerals or symbols same with or similar to each other will refer to elements same with or similar to each other without duplicating explanations.

FIG. 1 shows a cross section of a high electron-mobility transistor (HEMT) according to one embodiment of the present invention. The HMET 1A shown in FIG. 1 includes a substrate 11, a semiconductor stack 12, a source electrode 31, a drain electrode 32, and a gate electrode 33. The semiconductor stack 12 includes, from the side of the substrate 11, a buffer layer 13, a channel layer made of GaN, an electron supply layer (hereafter called as a barrier layer) 15, and n-type regions, 16a and 16b. A passivation layer 41 that protects a surface of the HEMT 1A provides openings in areas corresponding to the source, drain, and gate electrodes, 31 to 33, where those electrodes, 31 to 33, are electrically connected to respective interconnections through the openings.

The substrate 11, which is provided for growing semiconductor layers, may be made of silicon carbide (sic), sapphire, silicon (Si), and so on. The buffer layer 13, which is grown on the substrate 11, may be made of nitride semiconductor material containing aluminum (Al), typically, AlN and/or AlGaN, and have a thickness greater than 10 nm but less than 300 nm. The GaN channel layer 14, which is grown on the buffer layer 13, may have a thickness, for instance, greater than 400 nm but less than 1200 nm.

The barrier layer 15, which is epitaxially grown on the GaN channel layer 14, may be made of nitride semiconductor material having bandgap energy greater than that of the GaN channel layer 14, specifically, AlGaN, InAlN, and so on. The barrier layer 15 has a thickness greater than 5 nm but less than 20 nm, preferably around 8 nm. The barrier layer 15 induces a two-dimensional electrode gas (2DEG) in an interface against the GaN channel layer, which forms the channel in the GaN channel layer 14 adjacent to the interface. When the barrier layer 15 is made of InAlN; a preferable range of the indium (In) composition is between 15% and 19%, typically 17%, which may be determined based on the lattice matching against the GaN channel layer 14.

The n-type regions, 16a and 16b, may be grown within recesses formed in portions of the barrier layer 15 and the GaN channel layer 14. The n-type regions, 16a and 16b, may be made of n-type ZnO, typically, an n-type ZnO, n-type ZnMgO and so on. The n-type regions, 16a and 16b, may be doped with at least one of aluminum (Al) and gallium (Ga) in a high concentration. The n-type regions, 16a and 16b, has impurity density greater than $1 \times 10^{20}$ cm$^{-3}$ and a depth greater than a thickness of the barrier layer 15 but smaller than a total thickness of the barrier layer 15 and the GaN channel layer 14. Accordingly, the n-type regions, 16a and 16b, are directly in contact to the channel in the GaN channel layer 14 and the barrier layer 15 so as to sandwich the barrier layer 15 therebetween. Specifically, the n-type regions, 16a and 16b, may have the depth greater than 40 nm but less than 200 nm, where the n-type regions, 16a and 16b, of the present invention has a depth of 120 nm.

The source, drain, and gate electrodes, 31 to 33, are arranged on the semiconductor stack 12 in this order. The source electrode 31 makes ohmic contact against the n-type region 16a; while, the drain electrode 32 makes ohmic contact against the other n-type region 16b. The present embodiment provides the source and drain electrodes, 31 and 32, on the top surface of the semiconductor stack 12, but, the transistor 1A may provide those electrodes, 31 and 32, on hollowed portions on the surface of the semiconductor stack 12. The gate electrode 33 is provided on the barrier layer 15 between the n-type regions, 16a and 16b, and directly in contact to the barrier layer 15.

The passivation layer 41, which covers the surface of the semiconductor exposed between the electrodes, 31 to 33, may be made of inorganic material, typically, silicon nitride (SiN), silicon die-oxide (SiO$_2$), and silicon-oxy-nitride (SiON).

Next, a process of forming the HEMT 1A will be described as referring to FIGS. 2A to 4. The process first grows the buffer layer 13, the GaN channel layer 14, and the barrier layer 15 in this order on the substrate 11. Specifically, loading the substrate 11 within a growth chamber of the metal organized chemical vapor deposition (MOCVD) apparatus and supplying tri-methyl-aluminum (TMA) and ammonia (NH$_3$) as source materials for aluminum (Al) and nitrogen (N); the AlN buffer layer 13 is epitaxially grown on the substrate 11. The growth temperature may be, for instance, 1000 to 1200° C.; where the present embodiment sets the growth temperature to be 1080° C. Then, supplying tri-methyl-gallium (TMG) and ammonia (NH$_3$) and setting a temperature and a pressure to be 1000 to 1100° C., for instance, 1080° C. and 13.3 kPa, respectively; the GaN channel layer 14 is grown on the AlN buffer layer 13. Next, the barrier layer 15 is epitaxially grown on the GaN channel layer 14. When the barrier layer 15 is made of InAlN, supplying tri-methyl-indium (TMI), TMA, and NH$_3$, and setting a temperature between 650° C. and 850° C., typically around 800° C.; the InAlN barrier layer 15 is grown on the GaN channel layer 14. When the barrier layer 15 is made of AlGaN, supplying TMA, TMG, and ammonia (NH$_3$) and setting the growth temperature to be 1000 to 1200° C., typically, 1080° C. and the growth pressure to be 13.3 kPa; the barrier layer 15 made of AlGaN may be grown.

Thus, the process may form an epitaxial substrate 51, which includes the AlN buffer layer 13, the GaN channel layer 14, and the InAlN barrier layer, on the substrate 11. Thus, the epitaxial substrate 51 providing the buffer layer 12 to the barrier layer 15 on the substrate 11 may be obtained.

Then, the epitaxial substrate 51 is transferred to an etching apparatus, typically, an apparatus of reactive ion etching (RIE) from the MOCVD apparatus. Supplying a reactive gas containing chlorine (Cl), the process may remove regions, A1 and A2, indicated in FIG. 2A to form recesses 61 piercing the barrier layer 15 and reaching the GaN channel layer 14. That is, the recesses 61 exposes surfaces 61a of the GaN channel layer 14 in bottoms thereof; and have depths at least 80 nm from the top of the barrier layer 15.

Figure 2A:
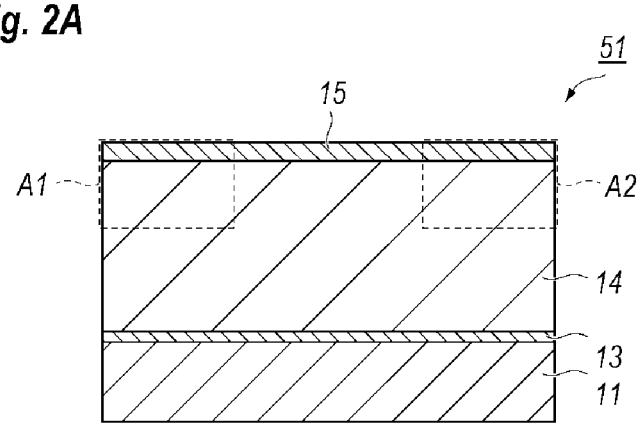
FIGS. 2A and 2B show processes of forming the HEMT shown in FIG. 1.
Figure 2B:
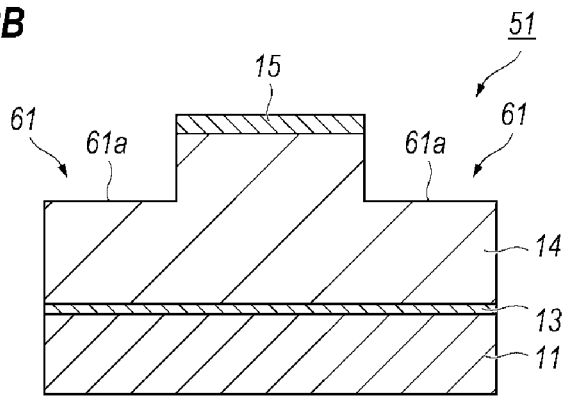

Then, the epitaxial substrate 51 is rinsed to remove residues left on the surface of the barrier layer 15 and the exposed surfaced of the GaN channel layer 14. A chloric acid (HCl) and/or fluoric acid (HF) may rinse the epitaxial substrate 51 (FIG. 2B).

Figure 3A:
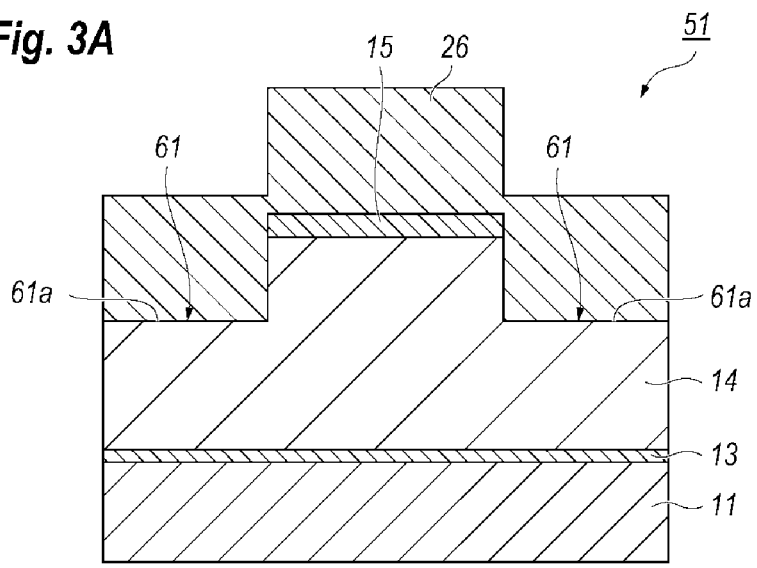
FIGS. 3A and 3B show processes of forming the HEMT subsequent to the process shown in FIG. 2B.
Figure 3B:
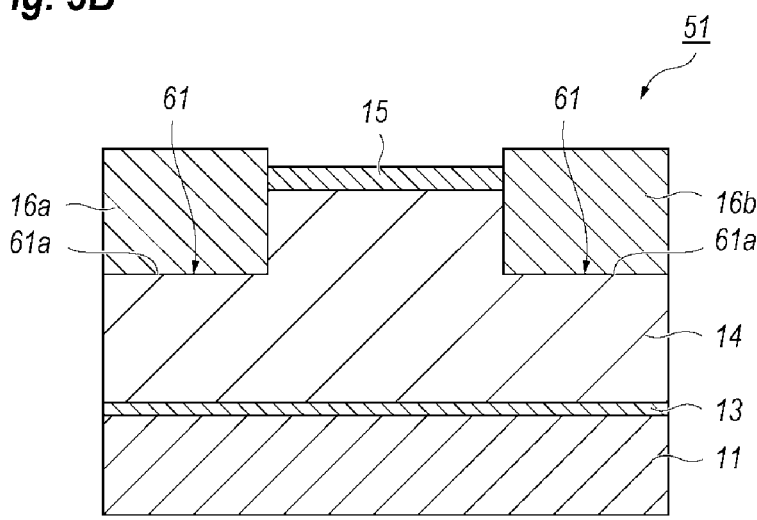

Then, the process carries out the re-growth of an n-type semiconductor film 26 on a whole surface of the epitaxial substrate 51, specifically, on the top surface of the barrier layer 15 and the exposed surface 61a in the bottom of the recesses 61, as shown in FIG. 3A. The n-type semiconductor film 26 may be made of n-type ZnO heavily doped with at least one of aluminum (Al) and gallium (Ga) by density at least $1 \times 10^{20}$ cm$^{-3}$. The growth temperature of the n-type ZnO film 26 is preferably lower than 700° C. in order to suppress vacancies of nitrogen (N) from the surface of the barrier layer 15. When the n-type region is made of ZnO, the ZnO may be epitaxially grown within oxide plasma using solidified source of zinc (Zn) at a temperature of 600° C. The ZnO film 26 thus grown is thermally treated in a temperature higher than 600° C. but not higher than 800° C., where the present embodiment thermally treats the n-type ZnO layer 26 at 800° C. for a half hour, which may recover the quality of the interface against the barrier layer 15 and that against the GaN channel layer 14; and the crystal quality of the n-type ZnO film 26 itself.

Next, a patterned photoresist partially covers the n-type ZnO film 26 in portions corresponding to the recesses 61, that is, portions except for the top of the barrier layer 15 left between the recesses 61. Subsequently, the n-type ZnO film 26 exposed from thus formed photoresist is fully removed by dry-etching using reactive gas of hydrocarbon, for instance, $CH_4$, $C_2H_6$, $C_3H_8$, and so on, where those hydrocarbons may moderate plasma damage against a nitride semiconductor material, and enhance etching selectivity. That is, an etching of the n-type ZnO film 26 on the barrier layer 15 using a hydrocarbon may be facilitated and substantially stop at the barrier layer 15 without causing damages against the barrier layer 15. The etching gas may merge a very small amount of other gases, such as argon (Ar), hydrogen ($H_2$), oxygen ($O_2$), and so on in order to stabilize the plasma and to accelerate the etching. The etching of the n-type ZnO film 26 thus described may leave the n-type ZnO regions, 16a and 16b, physically isolated to each other as putting the barrier layer 15, and a portion of the GaN channel layer 14 therebetween.

Figure 4:
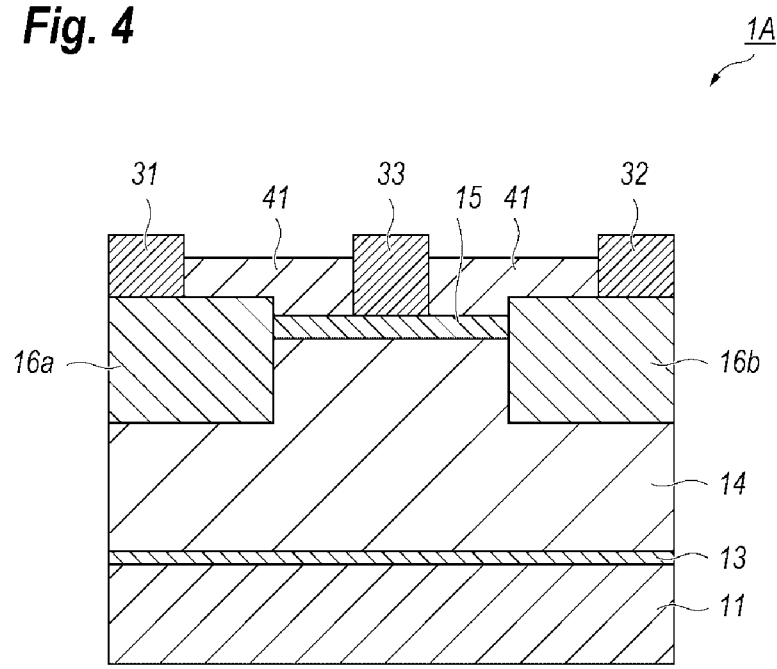
FIG. 4 shows a process of forming the HEMT subsequent to the process shown in FIG. 3B.
Figure 5A:
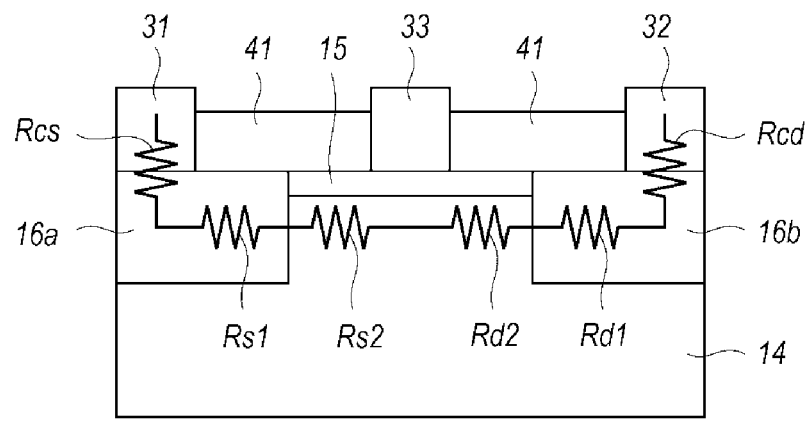
FIGS. 5A and 5B schematically indicate the contact resistance, the sheet resistance, and the channel resistance of the HEMT according to the embodiment of the present invention and that of the first example comparable to the present invention, respectively.
Figure 5B:
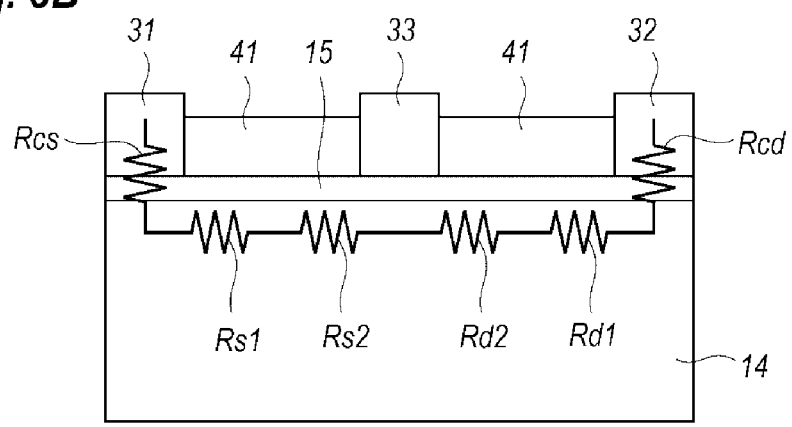
Figure 6:
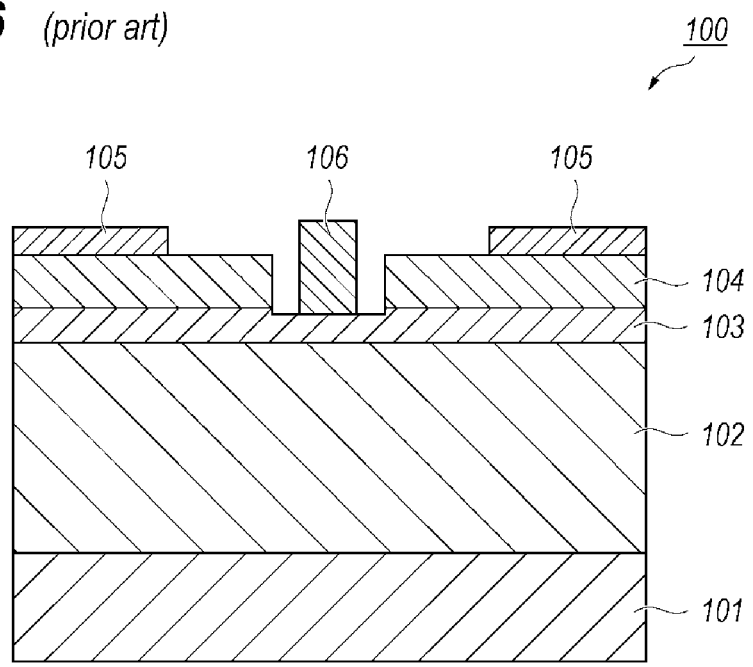
FIG. 6 schematically illustrates a cross section of a HEMT disclosed in the prior patent document.

After removing the patterned photoresist, the passivation layer 41 covers the whole surface of the n-type regions, 16a and 16b, and the barrier layer 15, and the source and drain electrodes, 31 and 32, are formed on the n-type regions, 16a and 16b, and the gate electrode 33 is formed on the barrier layer 15 as forming respective apertures in the passivation layer 41. Thus, the HEMT 1A is completed as shown in FIG. 4.

The HEMT 1A and the process of forming the HEMT 1A may show advantages as follows. When the n-type regions, 16a and 16b, are to be formed by n-type GaN regions doped with silicon (Si), the carrier concentration thereof is unable to be increased as generally requested for those n-type regions because silane ($SiH_4$), which is generally used as a dopant for silicon (Si), is restricted in the activating efficiency within nitride semiconductor materials.

The n-type regions, 16a and 16b, generally request that a material comprising the n-type regions, 16a and 16b, (1) shows a higher carrier concentration even at higher mobility; (2) forms an interface with better quality against the GaN channel layer 14, that is, the interface against the GaN channel layer 14 does not cause any deteriorated regions to be a barrier for the carrier transportation, which is equivalent to conditions that physical properties thereof are similar to those of GaN and physically stabilized dimensions thereof; and (3) has the electron affinity close to that of the GaN channel layer 14, which may suppresses an increase of electrical resistance due to an enhanced band discontinuity $\Delta Ec$ against the GaN channel layer 14.

A zinc oxide (ZnO), in particular, an n-type ZnO may be a best candidate that satisfies three conditions above. An n-type ZnO doped with aluminum (Al), gallium (Ga), and so on may show the carrier concentration far greater than a limitation frequently experienced in a nitride semiconductor material, for instance, the electron concentration higher than $1 \times 10^{20}$ cm$^{-3}$ may be easily obtained in ZnO. Also, a ZnO has a lattice constant of 3.25 angstrom (A), which is very close to that of GaN, which is 3.19 angstrom. Moreover, a ZnO has electron affinity of 4.1 eV, which is nearly equal to that of GaN, which is 4.2 eV. Accordingly, the interface between a ZnO and GaN forms substantially no band discontinuity.

Thus, the n-type regions, 16a and 16b, made of n-type ZnO may show smaller contact resistance and smaller access resistance compared with a case where the n-type regions, 16a and 16b, are made of n-type GaN. A ZnO is hard to be formed by processes similar to the process to form a GaN layer. An n-type GaN layer may be generally formed by a selective growth of a GaN layer using a mask made of SiN, $SiO_2$, and so on, and subsequent lift-off technique by solving such mask by an acid. Such a selective growth and subsequent lift-off technique may form n-type GaN regions with suppressing or substantially preventing damage caused in a nitride semiconductor layer beneath the gate electrode. However, because a ZnO is hard to be selectively grown, and solvable for acids; the n-type ZnO regions, 16a and 16b, are impossible to be formed by processes similar to those for the n-type GaN regions.

When a semiconductor device has or requests precise dimensions as that of the HEMT 1A of the present invention, a wet-etching often causes problems in control of physical dimensions of the device; and a dry-etching may easily etch a nitride semiconductor material of the barrier layer which is made of, for instance, AlGaN, InAlN and so on, when the etching uses a reaction gas containing chlorine (Cl).

The hydrocarbon of the present embodiment may show an excellent etching rate for a ZnO against a nitride semiconductor material. That is, the dry-etching using hydrocarbon as the etching gas may etch substantially only ZnO and leave the nitride semiconductor material un-etched. Moreover, the dry etching using the hydrocarbon may cause substantially no damage against the nitride semiconductor material.

The ZnO film 26 may be epitaxially grown in the oxygen plasma using solidified Zn at a temperature lower than 700° C. Accordingly, the barrier layer 15 in the top surface thereof is caused with no change, or is not degraded in such a lowered temperature during the epitaxial growth of the ZnO layer 26. Also, the thermal treatment after the growth of the n-type ZnO film 26 but before the removal of the n-type ZnO film on the barrier layer 15 may recover the quality of the interface between the n-type ZnO layer and the GaN channel layer 14.

In an alternative, the n-type regions, 16a and 16b, may be made of ZnMgO doped with aluminum (Al) and/or gallium (Ga). The heavily doped GaN layer has the lattice constant slightly offset from that of the GaN channel layer. A ZnMgO has a lattice constant substantially same with that of the GaN channel layer even the ZnMgO is heavily doped with Al and/or Ga.

Next, the HEMT 1A of the present embodiment will be compared with other examples of HEMTs. One example has an arrangement that the source and drain electrodes, 31 and 32, are provided on the barrier layer 15 without forming the recesses 61 and the n-type regions, 16a and 16b. That is, the first example has no n-type regions, 16a and 16b. The second example has the n-type regions, 16a and 16b, but the n-type regions, 16a and 16b, are filled with heavily doped n-type GaN, not ZnO.

Embodiment

The embodiment first grew the AlN buffer layer 13 by a thickness of 30 nm on the SiC substrate 11 by the MOCVD technique. Conditions of the MOCVD growth were a growth temperature of 1080° C., a growth pressure of 13.3 kPa, source gases of TMA and NH$_3$ for aluminum (Al) and nitrogen (N), respectively. Second, the GaN channel layer 14 was grown also by the MOCVD technique, where the growth conditions were the temperature of 1080° C., the pressure of 13.3 kPa, and source gases of TMG and NH$_3$ for gallium (Ga) and nitrogen (N), respectively. Third, the InAlN barrier layer 15 was grown on the GaN channel layer 14 by a thickness of 8 nm and an aluminum composition of 17%, where the MOCVD conditions were the temperature of 800° C., the pressure of 15.0 kPa, and source gases of TMI, TMA and NH$_3$, for indium (In), aluminum (Al), and nitrogen (N), respectively. The InAlN barrier layer 15 thus grown had a lattice constant substantially matched with a lattice constant of GaN.

Then, partially removing the InAlN barrier layer 15 and the GaN channel layer 14 by the RIE technique using a reactive gas containing chlorine (Cl), the recesses 61 with a depth of 80 nm was formed. After rinsing the whole surface of the epitaxial substrate 51, the process epitaxially formed the ZnO film by a thickness of 120 nm using a solidified Zn in oxygen plasma at 600° C. The grown ZnO film had the doping density of $2.0 \times 10^{20}$ cm$^{-3}$. After the growth of the ZnO film, the epitaxial substrate was thermally treated at 800° C. for 30 minutes. Then, a portion of thus grown ZnO film was removed by covering portions thereof corresponding to the n-type regions, 16a and 16b, with a photoresist and subsequent dry-etching the ZnO film exposed from the photoresist using methane (CH$_4$).

After removing the photoresist, the source and drain electrodes, 31 and 32, which were a stack of titanium (Ti) and aluminum (Al), were formed directly on the n-type GaN regions, 16a and 16b, respectively. Also, the gate electrode 33 made of stacked metal of nickel (Ni) and gold (Au) was formed directly on the InAlN barrier layer 15. Finally, the protection film 41 made of silicon nitride (SiN) covered portions of the InAlN barrier layer 15 exposed between the electrodes, 31 to 33, and metal interconnections each connected to the electrodes, 31 to 33, were formed on the protection film 41. Thus, the HEMT of the embodiment was obtained.

First Comparable Example

The processes from the beginning through the growth of the semiconductor stack 12 according to the first comparable example were same with those of the embodiment described above including the growth conditions of the semiconductor layers, 13 to 15. Then, the electrodes, 31 to 33, of the source, drain and gate were formed directly on the InAlN barrier layer 15 without forming the recesses 61 and re-growing the n-type ZnO regions, 16a and 16b. The processes subsequent to the formation of the electrodes, 31 to 33, were also same with those of the first and second embodiment described above.

Second Comparable Example

The processes, from the beginning through the formation of the recesses 61 in the InAlN barrier layer 15 and the GaN channel layer 14, according to the second comparable example were same with those of the embodiment described above. Then, the MOCVD technique filled the recesses 61 by n-type GaN regions. The conditions of the MOCVD technique were the growth temperature of 1000° C., the growth pressure of 20.0 kPa, and the dopant source of SiH$_4$.

The n-type GaN regions thus formed had a thickness of 120 nm and the silicon (Si) density of $5.0 \times 10^{18}$ cm$^{-3}$. The processes subsequent to the formation of the n-type GaN regions were substantially same with those of the aforementioned embodiment and the first comparable example.

The HEMTs thus formed by the processes of the embodiment, and the first and second comparable examples commonly had the gate length Lg of 0.2 μm and a distance of 3.0 μm between the source electrode and the drain electrode.

Comparison of HEMTs

The HEMTs of the embodiment and those of the comparable examples were evaluated by supplying a drain bias of 10 V and a drain current of 200 mA/mm by adjusting gate biases. DC parameters and RF performances through S-parameters were evaluated. The HEMT according to the embodiment showed a cut-off frequency ft of 240 GHz and trans-conductance gm of 1200 mS/mm. On the other hand, the HEMT of the first comparable example exhibited the cut-off frequency ft of merely 80 GHz and the trans-conductance gm of 400 mS/mm, and the last HEMT of the second comparable example showed the cut-off frequency ft of 102 GHz, slightly greater than that of the first comparable example, and the trans-conductance gm of 510 mS/mm.

A table below summarizes the contact resistance of the source and drain electrodes against the n-type regions or the barrier layer 15, series resistance primarily due to the n-type regions, and channel resistance primary due to the GaN channel layer in the unit of sheet resistance (Ω/sq) and practical resistance (Ω·mm), respectively. The access resistance in the right end column is a sum of practical resistance.

|  |  | contact resistance Rcs, Rcd | series resistance Rs1, Rd1 | channel resistance Rs2, Rd2 | access resistance |
|---|---|---|---|---|---|
| Example 1 |  |  |  |  |  |
| sheet resistance | (Ω/sq) |  | 300 | 300 |  |
| practical resistance | (Ω · mm) | 0.6 | 0.15 | 0.15 | 1.8 |
| Example 2 |  |  |  |  |  |
| sheet resistance | (Ω/sq) |  | 200 | 400 |  |
| practical resistance | (Ω · mm) | 0.4 | 0.1 | 0.2 | 1.4 |
| Embodiment |  |  |  |  |  |
| sheet resistance | (Ω/sq) |  | 100 | 300 |  |
| practical resistance | (Ω · mm) | 0.1 | 0.05 | 0.15 | 0.6 |

The first comparable example in the top row, where the n-type regions were omitted and the electrodes were directly in contact to the InAlN barrier layer 15, showed the channel resistance comparable to other cases. However, because of the omission of the n-type regions, the contact resistance, Rcs and Rds, and the series resistance, Rs1 and Rd1, thereof became larger. Accordingly, the access resistance was left high, which is the primary reason why the HEMT of the first comparable example showed lesser cut-off frequency ft and the smaller trans-conductance gm.

For the second comparable example in the second row, because of the existence of the n-type GaN regions, the contact resistance, Rcs and Rds, and the sheet resistance, Rs1 and Rd1, became smaller compared with those of the first example. However, the channel resistance, Rs2 and Rd2 increased because the process of forming the n-type GaN regions raised the growth temperature thereof and the InAlN barrier layer exposed to such raised temperature degraded the crystal quality thereof, which increased the channel resistance, Rs2 and Rd2. The access resistance thereof lowered to 1.4 Ωmm and the HEMT of the second example showed performances slightly improved from those of the first comparable example.

Referring to the HEMT of the embodiment shown in the third row, the n-type ZnO regions, 16a and 16b, grown at relatively lower temperature (800° C.) remarkably increases the carrier concentration, for instance exceeding $1 \times 10^{20}$ cm$^{-3}$, which drastically reduced the contact resistance, Rcs and Rcd, and the sheet resistance, Rs1 and Rd1, without increasing the channel resistance, Rs2 and Rd2. That is, even the channel resistance, Rs2 and Rd2, were left substantially unchanged from those of the first comparable example, the contact resistance, Rcs and Rcd, and the sheet resistance, Rs1 and Rd1, thereof were remarkably reduced. Accordingly, the total access resistance became 0.6 Ωmm, which was one third of the first example, and smaller than half of the second example.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. For instance, the embodiment removes the ZnO layer 26 above the barrier layer 15 by the dry-etching using the hydrocarbon. However, the removal of the ZnO layer 26 may be carried out by the wet-etching using an etchant showing an etching rate for the ZnO layer far greater than that of a nitride semiconductor material. Also, the HEMT 1A may provide a cap layer made of nitride semiconductor material, typically GaN, with a thickness of several nano-meters on the barrier layer 15. The cap layer may reduce a leak current between the gate and the drain electrodes, 33 and 32, along the surface of the barrier layer 15. Therefore, it is intended that the present invention not be limited to the particular embodiments disclosed, but that the invention include all embodiments falling within the scope of the appended claims.

The present application claims the benefit of priority of Japanese Patent Application No. 2015-194350, filed on Sep. 30, 2015, which is incorporated herein by reference.

I claim:

1. A process of forming a high electron mobility transistor (HEMT) made of nitride semiconductor materials, comprising steps of:
    forming, a semiconductor stack on a substrate by epitaxially growing the nitride semiconductor materials;
    forming recesses by etching portions of the semiconductor stack;
    epitaxially growing n-type film within oxygen plasma at a temperature lower than 700° C. using a solidified zinc (Zn), the n-type film being made of at least one of zinc oxide (ZnO) and magnesium zinc oxide (MgZnO) each doped with at least one of aluminum (Al) and gallium (Ga);
    forming n-type regions by partially removing the n-type film except within the recesses by a dry-etching using hydrocarbon; and
    forming source and drain electrodes on the n-type regions.

2. The process of claim 1, wherein the step of forming the recesses includes a step of etching the semiconductor stack by a depth at least 80 nm.

3. The process claim 1, wherein the step of growing the n-type ZnO film is carried out at a temperature of 600° C.

4. The process of claim 1, further including a step of, after growing the n-type film but before partially removing the n-type film, thermally treating the n-type film at a temperature not higher than 800° C.

5. The process of claim 4, wherein the step of thermally treating the n-type film is carried out for 30 minutes.

6. The process of claim 1, wherein the step of partially removing the n-type film is carried out using methane (CH$_4$).

7. The process of claim 1, wherein the step of forming the semiconductor stack includes steps of: epitaxially growing a buffer layer on the substrate; epitaxially growing a channel layer made of gallium nitride at a temperature of 1000 to 1100° C. on the buffer layer; and epitaxially growing a barrier layer made of aluminum gallium nitride (AlGaN) at a temperature of 1000 to 1100° C.

8. The process of claim 1, wherein the step of forming the semiconductor stack includes steps of: epitaxially growing a buffer layer on the substrate; epitaxially growing a channel layer made of gallium nitride (GaN) at a temperature of 1000 to 1100° C. on the buffer layer; and epitaxially growing a barrier layer made of indium aluminum nitride (InAlN) at a temperature of 650 to 850° C.

9. The process of claim 8, wherein the step of forming the semiconductor stack further including a step of growing a cap layer made of GaN on the barrier layer.

* * * * *